(12) United States Patent
Jo et al.

(10) Patent No.: US 11,086,220 B2
(45) Date of Patent: Aug. 10, 2021

(54) UNDERLAYER COATING COMPOSITIONS FOR USE WITH PHOTORESISTS

(71) Applicant: Rohm and Haas Electronic Materials Korea Ltd., Chungcheongnam-do (KR)

(72) Inventors: Jung Kyu Jo, Chungcheongnam-do (KR); Jae Hwan Sim, Chungcheongnam-do (KR)

(73) Assignee: Rohm and Haas Electronic Materials Korea Ltd., Chungcheongnam-do (KR)

(*) Notice: Subject to any disclaimer, the term of this patent is extended or adjusted under 35 U.S.C. 154(b) by 0 days.

(21) Appl. No.: 15/800,040

(22) Filed: Oct. 31, 2017

(65) Prior Publication Data

US 2019/0129306 A1  May 2, 2019

(51) Int. Cl.
| | |
|---|---|
| *G03F 7/09* | (2006.01) |
| *G03F 7/40* | (2006.01) |
| *C09D 7/20* | (2018.01) |
| *C09D 5/00* | (2006.01) |
| *C09D 167/02* | (2006.01) |
| *C08G 63/685* | (2006.01) |
| *C08K 5/20* | (2006.01) |
| *C08K 5/101* | (2006.01) |

(52) U.S. Cl.
CPC ............ *G03F 7/09* (2013.01); *C08G 63/6856* (2013.01); *C09D 5/006* (2013.01); *C09D 7/20* (2018.01); *C09D 167/02* (2013.01); *G03F 7/091* (2013.01); *G03F 7/094* (2013.01); *G03F 7/40* (2013.01); *C08K 5/101* (2013.01); *C08K 5/20* (2013.01)

(58) Field of Classification Search
CPC ....................................................... G03F 7/091
See application file for complete search history.

(56) References Cited

U.S. PATENT DOCUMENTS

| | | | |
|---|---|---|---|
| 4,900,623 A | 2/1990 | Kohn | |
| 5,851,911 A * | 12/1998 | Farnworth | ............... H01L 24/11 |
| | | | 438/614 |
| 6,767,689 B2 | 7/2004 | Pavelchek et al. | |
| 6,887,648 B2 | 5/2005 | Pavelchek et al. | |
| 8,623,589 B2 | 1/2014 | Kudo et al. | |
| 9,005,873 B2 | 4/2015 | Sakamoto et al. | |
| 9,116,427 B2 * | 8/2015 | Kurita | ..................... G03F 7/094 |
| 9,541,834 B2 | 1/2017 | Pohlers et al. | |
| 10,790,146 B2 * | 9/2020 | Yamada | .................. G03F 7/091 |
| 2008/0268354 A1 | 10/2008 | Suzuki | |
| 2013/0137041 A1 | 5/2013 | Ogihara et al. | |
| 2015/0212414 A1 | 7/2015 | Pohlers et al. | |
| 2017/0283651 A1 | 10/2017 | Sim et al. | |
| 2018/0011405 A1 * | 1/2018 | Watanabe | ................ G03F 7/11 |
| 2018/0158674 A1 | 6/2018 | Kamada et al. | |
| 2018/0162968 A1 * | 6/2018 | Kinzie | .................... C08F 32/06 |
| 2018/0314152 A1 | 11/2018 | Yasuhara et al. | |

FOREIGN PATENT DOCUMENTS

| | | | |
|---|---|---|---|
| JP | 2017155261 A | | 9/2017 |
| WO | 9953405 A1 | | 10/1999 |
| WO | 201302209 A1 | | 1/2013 |

OTHER PUBLICATIONS

English language suimmary of Office Action dated Oct. 18, 2019 issued in Japanese counterpart application 2018-194101.
English language suimmary of Office Action dated issued in connection withh Korean counterpart application 10-2018-0130746.

\* cited by examiner

*Primary Examiner* — Kathleen Duda
(74) *Attorney, Agent, or Firm* — Mintz Levin Cohn Ferris Glovsky and Popeo, P.C.; Peter F. Corless

(57) ABSTRACT

Underlayer coating compositions are provided that comprise 1) a resin; and a solvent component comprising one or more solvents having a boiling of 200° C. or greater. Coating compositions are particularly useful with overcoated photoresist compositions imaged with EUV.

11 Claims, 2 Drawing Sheets

| AFM measurement | | | |
|---|---|---|---|
| Example 11 | Example 12 | Example 13 | Example 14 |
|  |  |  |  |
| Example 15 | Example 16 | Example 17 | Example 18 |
|  |  No pinhole |  No pinhole |  No pinhole |

# UNDERLAYER COATING COMPOSITIONS FOR USE WITH PHOTORESISTS

FIELD

The present invention relates to new methods and underlayer coating compositions for use with photoresist compositions.

INTRODUCTION

Photoresists are photosensitive films for transfer of images to a substrate. They form negative or positive images. After coating a photoresist on a substrate, the coating is exposed through a patterned photomask to a source of activating energy such as ultraviolet light to form a latent image in the photoresist coating. The photomask has areas opaque and transparent to activating radiation that define an image desired to be transferred to the underlying substrate. A relief image is provided by development of the latent image pattern in the resist coating.

Known photoresists can provide features having resolution and dimension sufficient for many existing commercial applications. However for many other applications, the need exists for new photoresists and related materials and processes that can provide highly resolved images of submicron dimension.

Reflection of activating radiation used to expose a photoresist often poses limits on resolution of the image patterned in the photoresist layer. The amount of scattering and reflection of imaging radiation will typically vary from region to region, resulting in further linewidth non-uniformity. Variations in substrate topography also can give rise to resolution-limiting problems.

One approach used to reduce the problem of reflected radiation has been the use of a radiation absorbing layer interposed between the substrate surface and the photoresist coating layer. Such layers have also been referred to as antireflective layers or antireflective compositions. See U.S. Pat. No. 9,541,834; US20150212414; U.S. Pat. No. 6,767,689B2; U.S. Pat. No. 6,887,648B2; and U.S. Pat. No. 8,623,589.

Extreme Ultra-Violet (EUV) lithography is a next patterning system over the 193 nm immersion process. Certain coating layers have been reported for use beneath a photoresist imaged with EUV radiation. See U.S. Pat. No. 9,005,873 and WO2013/02209.

It would be desirable to have new coating compositions for use with an overcoated photoresist composition.

SUMMARY

We have found that thin underlayer or bottom organic coating layers used with overcoating photoresists can spontaneously dewet during post-application thermal treatment which can result in unacceptable pinhole defects. Such pinhole issues can become more prevalent as the thickness of the underlying coating layer decreases.

We now provide new fluid coating compositions useful as underlayer coating compositions for use with an overcoated photoresist.

Preferred coating compositions can be preferably used with an overcoated photoresist composition that is imaged with EUV radiation (13.5 nm). Both the underlayer coating composition and overcoated photoresist composition can be applied as thin layers, for a dried layer thickness of the underlayer composition of 100 or 50 angstroms or less, and a dried player thickness of the photoresist composition of 500, 400, 300, 250 or 200 angstroms or less.

We have surprisingly found that preferred coated compositions can exhibit reduced defects upon lithographic processing, including reduced occurrence of pinholes in an applied layer of the coating composition.

In one aspect, underlayer coating compositions are provided are that comprise: i) a resin and ii) a solvent component comprising one or more solvents having a boiling of 200° C. or greater. Preferably, the solvent component may include one or more of: gamma butyrolactone, N-methyl pyrrolidine, and benzyl benzoate.

We have surprisingly found that including one or more solvents having a boiling of 200° C. or greater in the coating composition can significantly reduce the occurrence of pinhole defects relative to a comparable composition that does not include such high boiling solvent. See, for instance, the comparative results set forth in the examples which follow.

We also have surprisingly found that including relatively small amount of one or more solvents having a boiling of 200° C. or greater in an underlayer coating composition can result in reduced defects upon lithographic processing. For instance, it has been found that use of 0.5 or 1 weight percent of one or more solvents having a boiling of 200° C. or greater based on total weight of total solvent present in the underlayer coating composition can result in reduced defects upon lithographic processing. As referred to herein, the term solvent indicates a fluid carrier for the coating composition where the fluid carrier typically does not undergo covalent bond breakage or formation during lithographic processing. Thus, as referred to herein, the term solvent does not include the resin component, separate crosslinker component, acid generator compounds and the like.

A coating of an underlayer coating composition may be applied to have a dried layer thickness of a variety of dimensions, including for instance 300, 200, 100 or 50 angstroms or less. As referred to herein, a dried coating layer is provided by thermal treatment of an applied (e.g. spin-coated) composition layer at 205° C. for 60 seconds.

The underlayer coating compositions suitably also may comprise one or more additional solvents that have boiling points less than 200° C., such as a lactate, glycol ether, ketone solvent, including methyl-2-hydroxy isobutyrate, ethyl lactate, propylene glycol methyl ether acetate, propylene glycol monomethyl ether, ethyl ethoxy propionate and/or cyclohexanone.

The underlayer coating compositions may optionally comprise additional materials for example a separate crosslinker component and one or more acid generators (e.g. a thermal acid generator and/or photoacid generator).

As discussed, in certain preferred aspects, an overcoated photoresist composition may be imaged with EUV radiation and the imaged photoresist composition layer developed to provide a photoresist relief image.

Further provided are coated substrates that may include a substrate having thereon: a) a coating composition including 1) a resin and 2) a solvent component comprising one or more solvents having a boiling of 200° C. or greater; and b) a layer of a photoresist composition above the coating composition layer. Preferably, the solvent component may include one or more of: gamma butyrolactone, N-methyl pyrrolidine, and benzyl benzoate.

In certain preferred aspects, the solvent component (i.e. total solvent present in the underlayer composition) of an underlayer coating composition may consist essentially of one or more of: gamma butyrolactone; N-methyl pyrrolidine; and benzyl benzoate.

In certain other preferred aspects, the solvent component (i.e. total solvent present in the underlayer composition) of an underlayer coating composition may consist of one or more of: gamma butyrolactone; N-methyl pyrrolidine; and benzyl benzoate.

In additional aspects, preferred are underlying coating compositions where at least 0.5 or 1 of the total weight percent of all solvent present in the coating composition is gamma butyrolactone; N-methyl pyrrolidine; and/or benzyl benzoate and/or other solvent having a boiling point of 200° C. In certain aspects, an underlayer coating composition will contain no more than 70, 60, 50, 40, 30, 20 or 10 weight percent of gamma butyrolactone; N-methyl pyrrolidine; and/or benzyl benzoate and/or other solvent having a boiling point of 200° C. or greater based on total weight of solvent present in the coating compositions.

Other aspects of the invention are disclosed infra.

DETAILED DESCRIPTION

Figure 1:
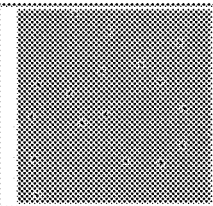
FIG. 1 are surface images of applied and thermally treated composition coating layers of Examples 1-10 detected by atomic force microscopy (AFM).

In one aspect, the present method may include applying on a substrate a layer of a fluid coating composition that includes a resin and a solvent component; and applying a layer of a photoresist composition above the coating composition layer. In one preferred aspect, the method includes forming on substrates pinhole-free resist underlayer film for Extreme Ultra-Violet (EUV) lithography. Preferred underlayer film provided herein can be substantially free or free of defects such as pin-holes (as determined by AFM) following a post-application-thermal-treatment.

Extreme Ultra-Violet (EUV) lithography is an emerging technology following a 193 nm immersion process in photolithography. As pattern sizes shrink to sub-20 nm range, it can be necessary to use thinner resist films to prevent pattern collapse from high aspect ratios. However, on inorganic hardmask such as deposited by atomic layer deposition (ALD), chemically amplified EUV resists have suffered from pattern collapse due at least in part to poor adhesion to an underlying surface. To overcome this issue, for EUV patterning, we have applied such as by spin coating a thin (e. 100 or 50 angstroms or less) underlayer between photoresist and inorganic hardmask that can provide enhanced adhesion of the photoresist. Due to reduced thickness of photoresist (e.g., about 200-400 Å), the thickness of an underlayer film often may be about 100 or 50 Å or less. We have found that when the underlayer thickness is reduced to less than about 100 Å, pin-hole defect may be generated following spin coating and bake of the underlayer films, which may not occur where the film has a thickness greater than 100 Å.

Preferably, the underlayer coating composition may be a cross-linked organic film and have a substantially reduced thickness. In certain preferred embodiments, the underlayer composition film layer dried thickness is about 200 Å or less, or about 150 Å or less, or about 100 Å or less, or about 90 Å or less, or about 80 Å or less, or about 70 Å or less, or about 60 Å or less, or of about 50 Å or less. In one exemplary embodiment, the applied photoresist composition may suitably have a thickness of 50 Å or less.

In preferred embodiments, the photoresist composition may be imaged with EUV radiation and the imaged photoresist composition layer is developed to provide a photoresist relief image.

The applying methods of the fluid coating composition and the photoresist composition above the coating composition are not particularly limited among the method generally used in the related arts. Exemplary method may include, but not be limited to, dipping, spraying, or spin coating. Preferably, the coating composition may be spin coated on the substrate. In addition, the coating composition may be spin coated on the substrate and thermally treated to provide a coating composition layer that is at least substantially free of pinholes.

In one preferred embodiments, coating composition layer may suitably be thermally treated to remove solvent and provide a thermally treated coating composition layer having a thickness of 100 angstroms or less, or 60 or 50 angstroms or less. Thermal treating may be performed at a variety of conditions such as about 160° C. or greater, or about 180° C. or greater, or about 200° C. or greater for 30 to 90 seconds.

Preferably, the solvent component of an underlayer coating composition may comprise a mixture of two or more distinct solvents. Suitably, each of the multiple solvents are miscible with each other.

A variety of materials may be employed as a resin component of the underlayer coating compositions. Particularly preferred resins of coating compositions of the invention may comprise polyester linkages. Polyester resins can be readily prepared by reaction of one or more polyol reagents with one or more carboxy-containing (such as a carboxylic acid, ester, anhydride, etc.) compounds. Suitable polyol reagents include diols, glycerols and triols such as e.g. diols such as diol is ethylene glycol, 1,2-propylene glycol, 1,3-propylene glycol, butane diol, pentane diol, cyclobutyl diol, cyclopentyl diol, cyclohexyl diol, dimethylolcyclohexane, and triols such as glycerol, trimethylolethane, trimethylolpropane and the like.

Preferred resins of underlayer coating compositions of the invention will have a weight average molecular weight (Mw) of about 1,000 to about 10,000,000 daltons, more typically about 2,000 to about 10,000 daltons, and a number average molecular weight (Mn) of about 500 to about 1,000,000 daltons. Molecular weights (either Mw or Mn) of the resins of compositions of the invention are suitably determined by gel permeation chromatography.

The resin component will be the major solids component of an underlayer coating composition in many preferred embodiments. For instance, one or resins suitably may be present from 50 to 99.9 weight percent based on total solid content of a coating composition, more typically from 80 or 85 to 95, 98 or 99+(or even 100) weight percent based total solid content of a coating composition. As referred to herein, solids of a coating composition refer to all materials of the coating composition except solvent carrier.

Specifically preferred resins for use in the present underlayer coating compositions include those that contain repeat units that contain one or more structures shown below between the pair of brackets:

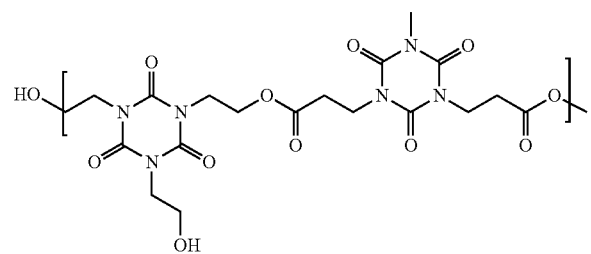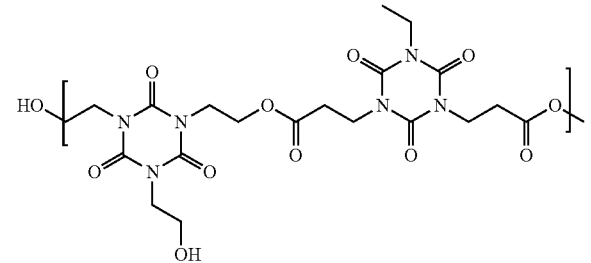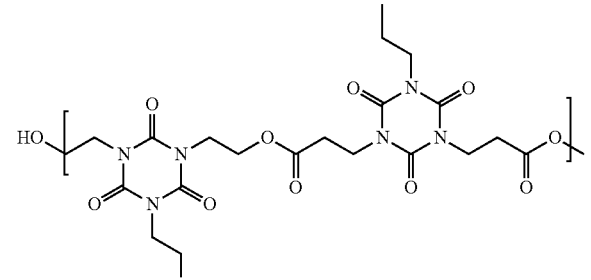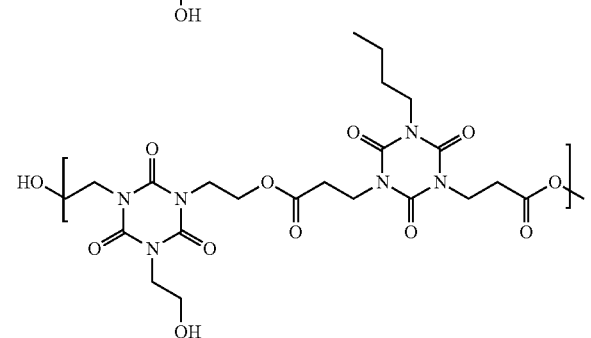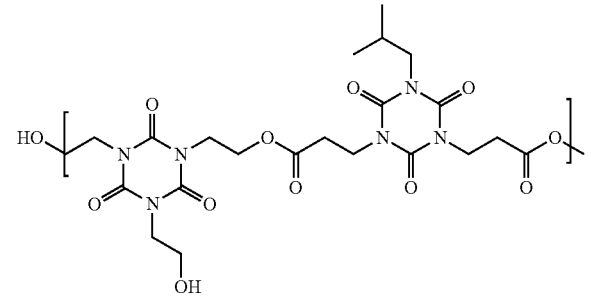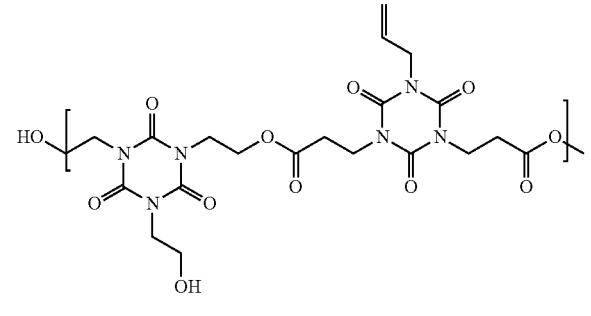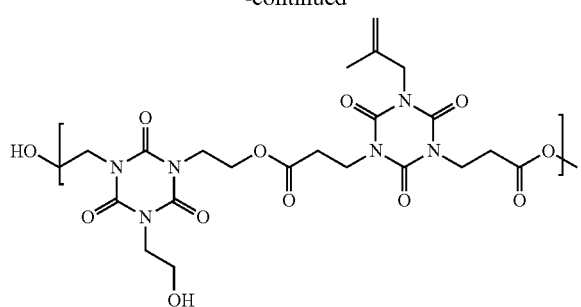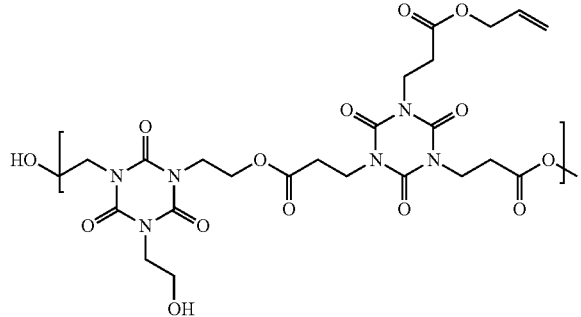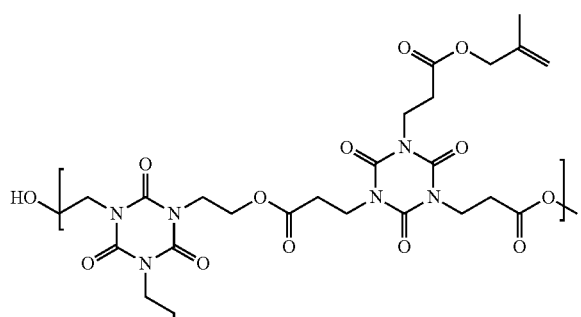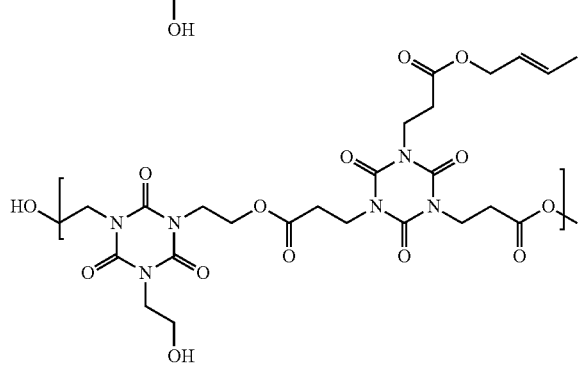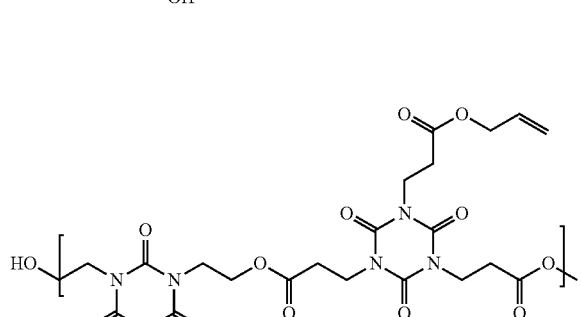

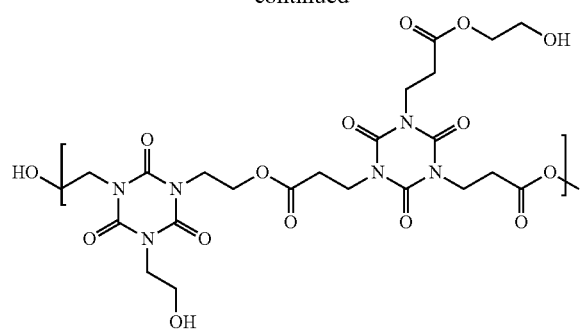
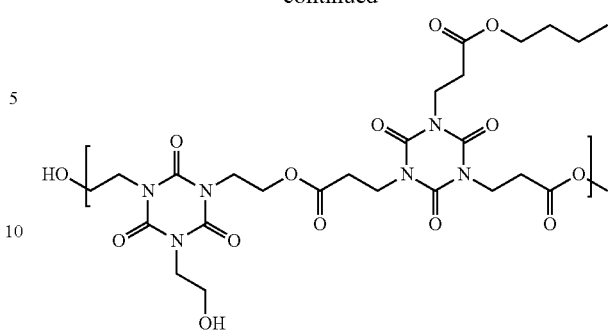

-continued

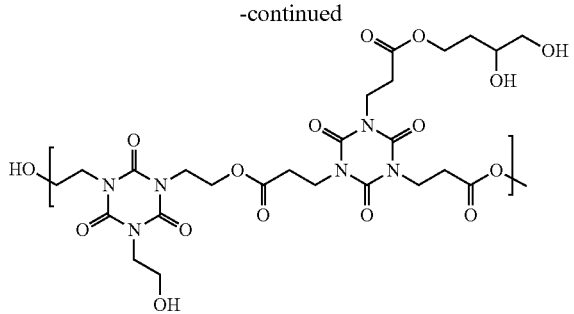
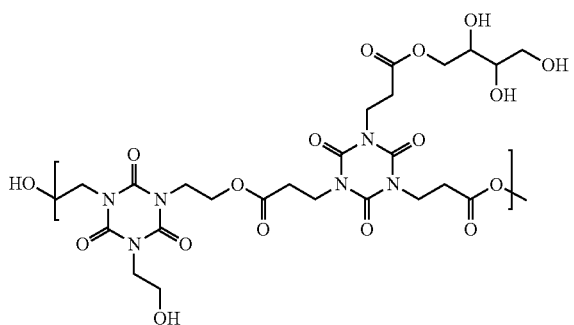
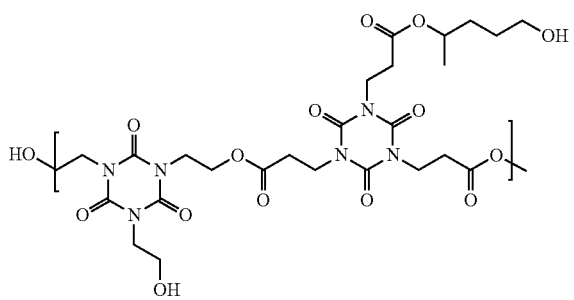
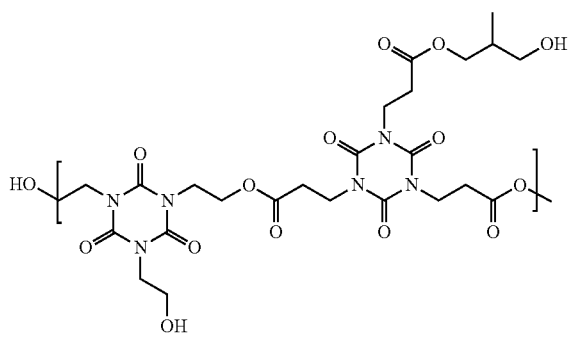
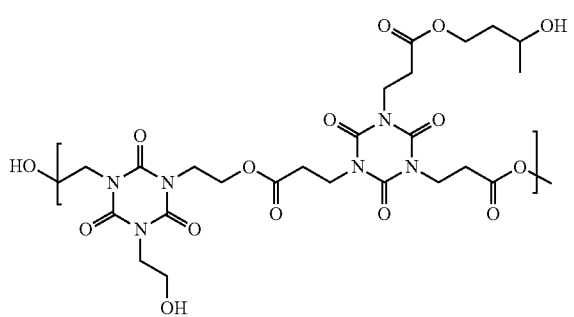

-continued

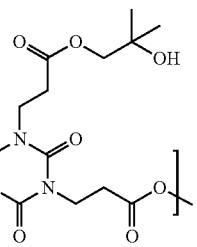
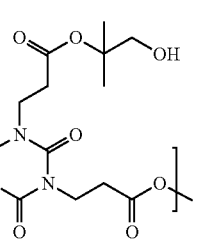
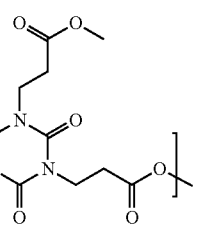
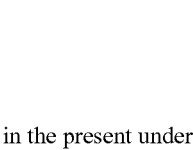

Suitable and preferred resins for use in the present underlayer compositions can be readily prepared. See, for instance, Example 1, which follows and details reaction of an isocyanuarate reagent to provide a polyester cyanurate resin.

As discussed above, in certain embodiments, the coating composition of the invention may comprise a crosslinker in addition to or as a component of a resin. For example, coating compositions may include amine-based crosslinkers such as melamine materials, including melamine resins such as manufactured by Cytec Industries and sold under the tradename of Cymel 300, 301, 303, 350, 370, 380, 1116 and 1130; glycolurils including those glycolurils available from Cytec Industries; and benzoquanamines and urea-based materials including resins such as the benzoquanamine resins available from Cytec Industries under the name Cymel 1123 and 1125, and urea resins available from Cytec Industries under the names of Powderlink 1174 and 1196. In addition to being commercially available, such amine-based resins may be prepared e.g. by the reaction of acrylamide or methacrylamide copolymers with formaldehyde in an alcohol-containing solution, or alternatively by the copolymerization of N-alkoxymethyl acrylamide or methacrylamide with other suitable monomers.

Coating compositions of the invention, particularly for reflection control applications, also may contain additional dye compounds that absorb radiation used to expose an overcoated photoresist layer.

Underlayer coating compositions of the invention also may contain other materials such as one or more acid generator compounds, including one or more thermal acid generators and/or photoacid generators. Suitable photoacid generator for use in an underlayer coating composition include photoacid generators disclosed herein for an overcoated photoresist composition. See U.S. Pat. No. 6,261,743 for a discussion of such use of a photoacid generator in an underlying coating composition.

To make a liquid underlayer coating composition, the components of the coating composition are dissolved in a suitable solvent such as, for example, one or more oxyisobutyric acid esters particularly methyl-2-hydroxyisobutyrate, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol, and ethoxy propanol; methyl 2-hydroxyisobutyrate; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone.

As discussed, the solvent component will contain one or more solvents having a boiling of 200° C. or greater. Preferred solvents having a boiling point of great than 200° C. include gamma butyrolactone, N-methyl pyrrolidine, and benzyl benzoate.

As also discussed preferred are underlayer coating compositions where at least 0.5 or 1 of the total weight percent of all solvent present in the coating composition is one or more solvents having a boiling point of 200° C. or greater such as one or more of gamma butyrolactone; N-methyl pyrrolidine; and/or benzyl benzoate. In certain aspects, an underlayer coating composition will contain no more than 70, 60, 50, 40, 30, 20 or 10 of solvent(s) having a boiling point of 200° C. or greater (such as gamma butyrolactone; N-methyl pyrrolidine; and/or benzyl benzoate) based on total weight of solvent present in the coating compositions.

The concentration of the dry components in the solvent will depend on several factors such as the method of application. In general, the solid content of an underlayer coating composition varies from about 0.1 to 20 weight percent of the total weight of the coating composition, preferably the solid content varies from about 0.1 to 10 weight of the coating composition.

Photoresists

Photoresists for use with an underlayer coating composition typically comprise a polymer and one or more acid generators. Generally preferred are positive-tone resists and the resist polymer has functional groups that impart alkaline aqueous solubility to the resist composition. For example, preferred are polymers that comprise polar functional groups such as hydroxyl or carboxylate, or acid-labile groups that can liberate such polar moieties upon lithographic processing. Preferably the polymer is used in a resist composition in an amount sufficient to render the resist developable with an aqueous alkaline solution.

Acid generators are also suitably used with polymers that comprise repeat units containing aromatic groups, such as optionally substituted phenyl including phenol, optionally substituted naphthyl, and optionally substituted anthracene. Optionally substituted phenyl (including phenol) containing polymers are particularly suitable for many resist systems, including those imaged with EUV and e-beam radiation. For positive-acting resists, the polymer also preferably contains one or more repeat units that comprise acid-labile groups.

For example, in the case of polymers containing optionally substituted phenyl or other aromatic groups, a polymer may comprise repeat units that contain one or more acid-labile moieties such as a polymer that is formed by polymerization of monomers of an acrylate or methacrylate compound with acid-labile ester (e.g. t-butyl acrylate or t-butyl methacrylate). Such monomers may be copolymerized with one or more other monomers that comprise aromatic group(s) such as optionally phenyl, e.g. a styrene or vinyl phenol monomer.

Preferred monomers used for the formation of such polymers include: an acid-labile monomer having the following formula (I), a lactone-containing monomer (II) and polarity control monomer of the following formula (III), or a combination comprising at least one of the foregoing monomers:

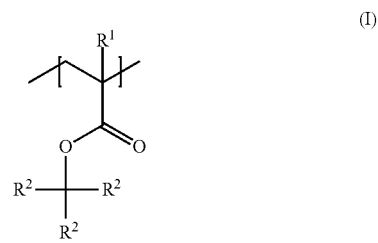

(I)

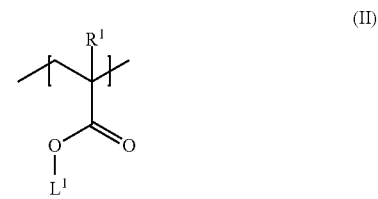

(II)

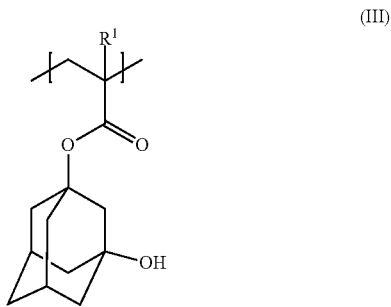

(III)

wherein each $R^1$ is independently H, F, —CN, $C_{1-6}$ alkyl, or $C_{1-6}$ fluoroalkyl. In the acid-deprotectable monomer of formula (I), $R^2$ is independently $C_{1-20}$ alkyl, $C_{3-20}$ cycloalkyl, or $C_{6-20}$ aryl, and each $R^2$ is separate or at least one $R^2$ is bonded to an adjacent $R^2$ to form a cyclic structure. In lactone-containing monomer of formula (II), $L^1$ is a monocyclic, polycyclic, or fused polycyclic $C_{4-20}$ lactone-containing group.

The unit of general formula (I) includes an acid labile group that undergoes a photoacid-promoted deprotection reaction on exposure to activating radiation and heat treatment. This allows for a switch in polarity of the matrix polymer, leading to a change in solubility of the polymer and photoresist composition in an organic developer. Suitable monomers for forming units of formula (I) include, for example, the following:

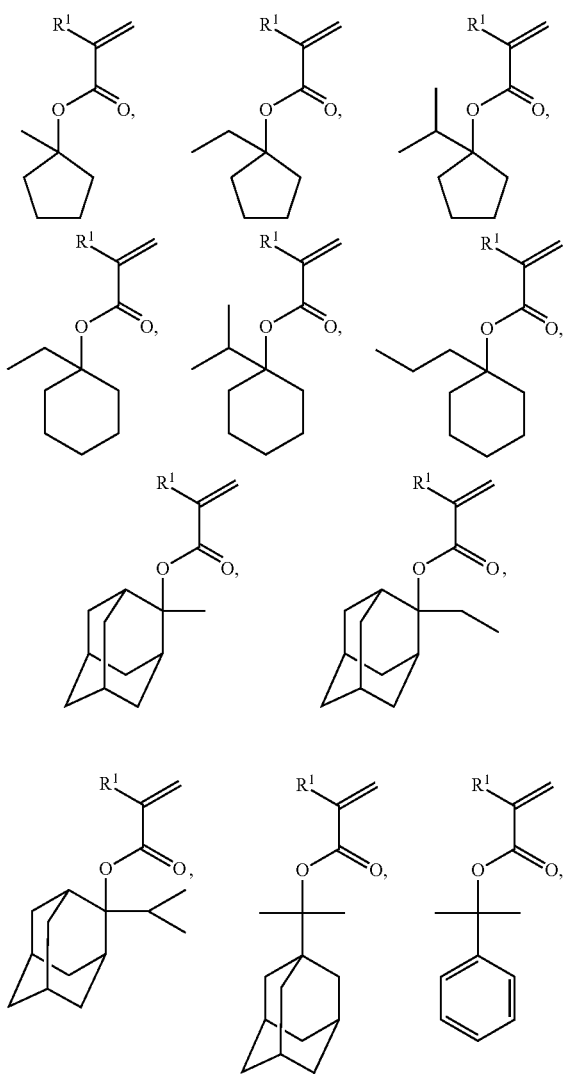

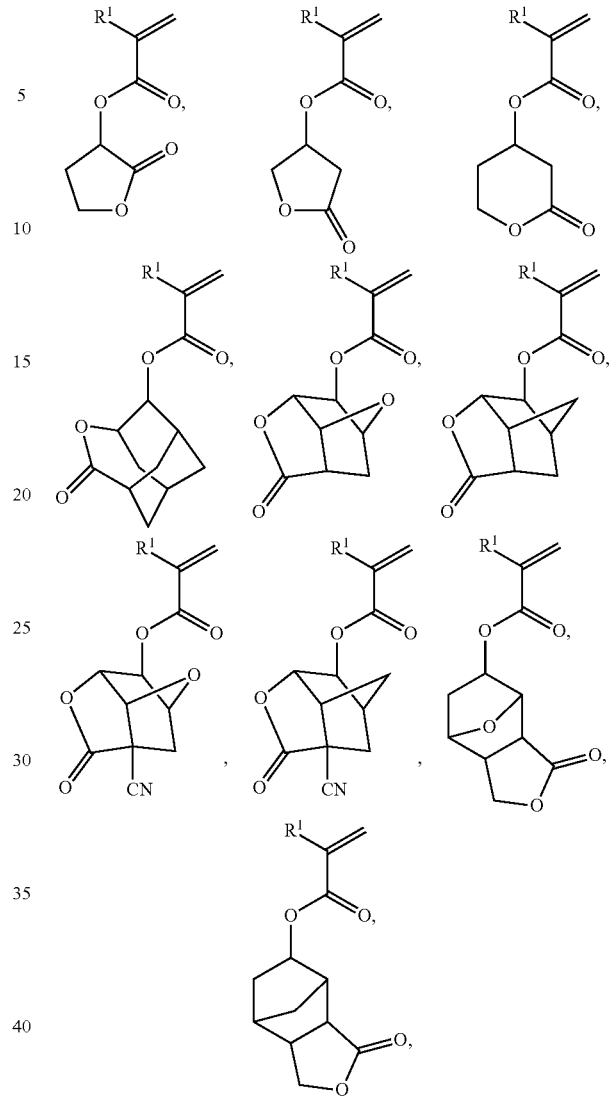

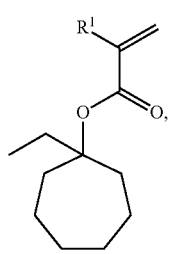

or a combination comprising at least one of the foregoing monomers, wherein $R^1$ is H, F, —CN, $C_{1-6}$ alkyl, or $C_{1-6}$ fluoroalkyl.

The unit of general formula (II) includes a lactone moiety effective to control the dissolution rate of the matrix polymer and photoresist composition. Suitable monomers for forming units of general formula (II) include, for example, the following:

or a combination comprising at least one of the foregoing monomers, wherein $R^1$ is H, F, —CN, $C_{1-6}$ alkyl, or $C_{1-6}$ fluoroalkyl.

The unit of formula (III) provides a polar group, which enhances etch resistance of the resin and photoresist composition and provides additional means to control the dissolution rate of the resin and photoresist composition. Monomers for forming the unit of formula (III) include 3-hydroxy-1-adamantyl methacrylate (HAMA) and preferably 3-hydroxy-1-adamantyl acrylate (HADA).

The resin can include one or more additional units of general formulae (I), (II) and/or (III) different from the first units. Where additional such units are present in the resin, they will preferably include an additional leaving group-containing unit of formula (I) and/or a lactone-containing unit of formula (II).

In addition to the polymerized units described above, the resin can include one or more additional units which are not of general formula (I), (II) or (III). For example, a particularly suitable lactone group-containing unit is of the following general formula (IV):

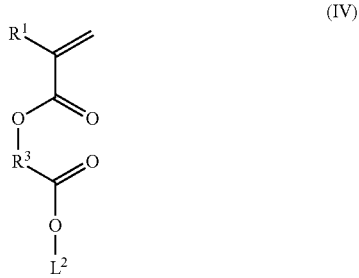

(IV)

wherein: $R^1$ is H, F, —CN, $C_{1-6}$ alkyl, or $C_{1-6}$ fluoroalkyl, heterocycloalkyl, $R^3$ is a $(C_1-C_3)$alkylene group and $L^2$ is a lactone group. The following exemplary monomers are suitable for use in forming the additional lactone unit of general formula (IV):

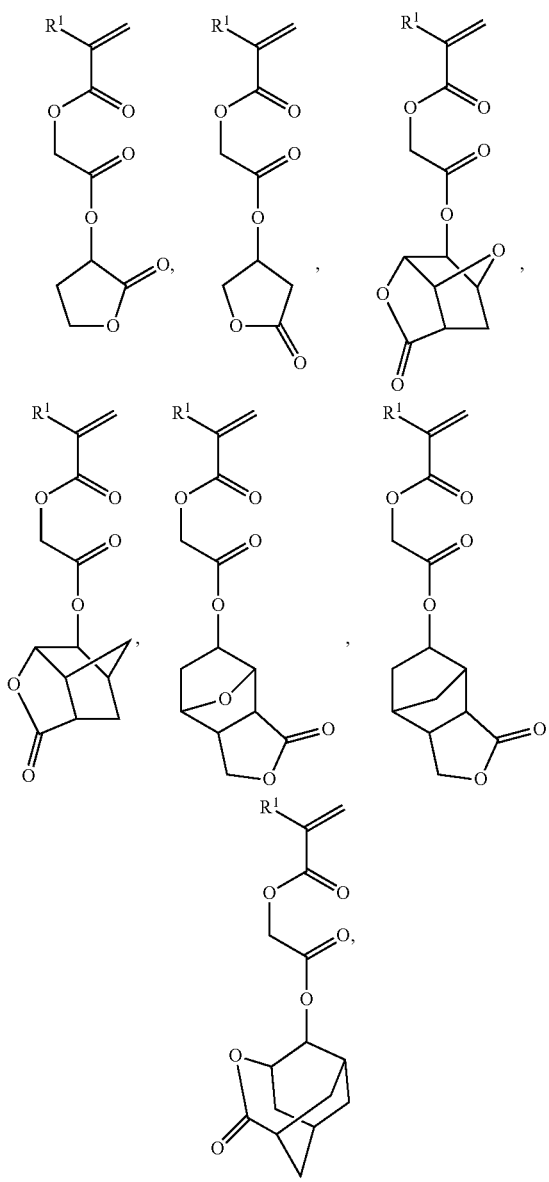

or a combination comprising at least one of the foregoing monomers, wherein $R^1$ is H, F, —CN, $C_{1-6}$ alkyl, or $C_{1-6}$ fluoroalkyl.

Specifically suitable polymers that have acid-labile deblocking groups for use in a positive-acting chemically-amplified photoresist of the invention have been disclosed in European Patent Application 0829766A2 (polymers with acetal and ketal polymers) and European Patent Application EP0783136A2 (terpolymers and other copolymers including units of 1) styrene; 2) hydroxystyrene; and 3) acid labile groups, particularly alkyl acrylate acid labile groups.

Polymers for use in photoresists of the invention may suitably vary widely in molecular weight and polydisperity. Suitable polymers include those that have an $M_w$ of from about 1,000 to about 50,000, more typically about 2,000 to about 30,000 with a molecular weight distribution of about 3 or less, more typically a molecular weight distribution of about 2 or less.

Preferred negative-acting compositions of the invention comprise a mixture of materials that will cure, crosslink or harden upon exposure to acid, and two or more acid generators as disclosed herein. Preferred negative acting compositions comprise a polymer binder such as a phenolic or non-aromatic polymer, a crosslinker component and a photoactive component of the invention. Such compositions and the use thereof have been disclosed in European Patent Applications 0164248 and U.S. Pat. No. 5,128,232 to Thackeray et al. Preferred phenolic polymers for use as the polymer binder component include novolaks and poly(vinylphenol)s such as those discussed above. Preferred crosslinkers include amine-based materials, including melamine, glycolurils, benzoguanamine-based materials and urea-based materials. Melamine-formaldehyde polymers are often particularly suitable. Such crosslinkers are commercially available, e.g. the melamine polymers, glycoluril polymers, urea-based polymer and benzoguanamine polymers, such as those sold by Cytec under tradenames Cymel 301, 303, 1170, 1171, 1172, 1123 and 1125 and Beetle 60, 65 and 80.

Particularly preferred photoresists of the invention may be used in immersion lithography applications. See, for example, U.S. Pat. No. 7,968,268 to Rohm and Haas Electronic Materials for a discussion of preferred immersion lithography photoresists and methods.

Photoresists of the invention also may comprise a single acid generator or a mixture of distinct acid generators, typically a mixture of 2 or 3 different acid generators, more typically a mixture that consists of a total of 2 distinct acid generators. The photoresist composition comprises an acid generator employed in an amount sufficient to generate a latent image in a coating layer of the composition upon exposure to activating radiation. For example, the acid generator will suitably be present in an amount of from 1 to 20 wt % based on total solids of the photoresist composition.

Suitable acid generators are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy) benzene, and 1,2,3-tris(p-toluenesulfonyloxy)benzene; diazomethane derivatives, for example, bis(benzenesulfonyl)

diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4, 6-bis(trichloromethyl)-1,3,5-triazine, and 2-(4-methoxynaphthyl)-4,6-bis(trichloromethyl)-1,3,5-triazine.

As referred to herein, acid generators can produce an acid when exposed to activating radiation, such as EUV radiation, e-beam radiation, 193 nm wavelength radiation or other radiation sources. Acid generator compounds as referred to herein also may be referred to as photoacid generator compounds.

Photoresists of the invention also may contain other materials. For example, other optional additives include actinic and contrast dyes, anti-striation agents, plasticizers, speed enhancers and sensitizers. Such optional additives typically will be present in minor concentration in a photoresist composition.

Alternatively, or in addition, other additives may include quenchers that are non-photo-destroyable bases, such as, for example, those based on hydroxides, carboxylates, amines, imines, and amides. Preferably, such quenchers include $C_{1-30}$ organic amines, imines, or amides, or may be a $C_{1-30}$ quaternary ammonium salt of a strong base (e.g., a hydroxide or alkoxide) or a weak base (e.g., a carboxylate). Exemplary quenchers include amines such as tripropylamine, dodecylamine, tris(2-hydroxypropyl)amine, oltetrakis (2-hydroxypropyl)ethylenediamine; aryl amines such as diphenylamine, triphenylamine, aminophenol, and 2-(4-aminophenyl)-2-(4-hydroxyphenyl)propane, a hindered amine such as diazabicycloundecene (DBU) or diazabicyclononene (DBN), or ionic quenchers including quaternary alkyl ammonium salts such as tetrabutylammonium hydroxide (TBAH) or tetrabutylammonium lactate. Surfactants include fluorinated and non-fluorinated surfactants, and are preferably non-ionic. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants from Omnova.

The photoresist further includes a solvent generally suitable for dissolving, dispensing, and coating the components used in a photoresists. Exemplary solvents include anisole, alcohols including ethyl lactate, 1-methoxy-2-propanol, and 1-ethoxy-2 propanol, esters including n-butylacetate, 1-methoxy-2-propyl acetate, methoxyethoxypropionate, ethoxyethoxypropionate, ketones including cyclohexanone and 2-heptanone, and a combination comprising at least one of the foregoing solvents.

Lithographic Processing

In use, an underlayer coating composition of the invention suitably may be applied as a coating layer to a substrate by any of a variety of methods such as spin coating. The coating composition in general is applied on a substrate with a dried layer thickness of between about 0.001 and 0.5 μm, including 0.002 and 0.01 μm. The substrate is suitably any substrate used in processes involving photoresists. For example, the substrate can be silicon, silicon dioxide or aluminum-aluminum oxide microelectronic wafers. Gallium arsenide, silicon carbide, ceramic, quartz or copper substrates may also be employed.

In certain aspects, including EUV imaging, the underlayer coating composition may be suitably applied over a hardmask layer.

Preferably the applied coating layer is cured before a photoresist composition is applied over the underlayer coating composition. Cure conditions will vary with the components of the underlayer coating composition. Particularly the cure temperature will depend on the specific acid or acid (e.g. thermal) generator that is employed in the coating composition. Typical cure conditions are from about 60° C. to 225° C. for about 0.5 to 5 minutes. Cure conditions preferably render the coating composition coating layer substantially insoluble to the photoresist solvent as well the developer solution to be used.

After such curing, a photoresist is applied above the surface of the applied coating composition. As with application of the bottom coating composition layer(s), the overcoated photoresist can be applied by any standard means such as by spinning, dipping, meniscus or roller coating. Following application, the photoresist coating layer is typically dried by heating to remove solvent preferably until the resist layer is tack free. Optimally, essentially no intermixing of the bottom composition layer and overcoated photoresist layer should occur.

The resist layer is then imaged with activating radiation such as 248 nm, 193 nm or EUV radiation through a mask in a conventional manner. The exposure energy is sufficient to effectively activate the photoactive component of the resist system to produce a patterned image in the resist coating layer. Typically, the exposure energy ranges from about 3 to 300 mJ/cm$^2$ and depending in part upon the exposure tool and the particular resist and resist processing that is employed. The exposed resist layer may be subjected to a post-exposure bake if desired to create or enhance solubility differences between exposed and unexposed regions of a coating layer. For example, negative acid-hardening photoresists typically require post-exposure heating to induce the acid-promoted crosslinking reaction, and many chemically amplified positive-acting resists require post-exposure heating to induce an acid-promoted deprotection reaction. Typically post-exposure bake conditions include temperatures of about 50° C. or greater, more specifically a temperature in the range of from about 50° C. to about 160° C.

The photoresist layer also may be exposed in an immersion lithography system, i.e. where the space between the exposure tool (particularly the projection lens) and the photoresist coated substrate is occupied by an immersion fluid, such as water or water mixed with one or more additives such as cesium sulfate which can provide a fluid of enhanced refractive index. Preferably the immersion fluid (e.g., water) has been treated to avoid bubbles, e.g. water can be degassed to avoid nanobubbles.

References herein to "immersion exposing" or other similar term indicates that exposure is conducted with such a fluid layer (e.g. water or water with additives) interposed between an exposure tool and the coated photoresist composition layer.

The exposed photoresist layer is then treated with a suitable developer capable of selectively removing portions of the film to form a photoresist pattern. In a negative tone development (NTD) process, unexposed regions of a photoresist layer can be selectively removed by treatment with a suitable nonpolar solvent. See U.S. 2011/0294069 for suitable procedures for negative tone development. Typical nonpolar solvents for negative tone development are organic developers, such as a solvent chosen from ketones, esters, hydrocarbons, and mixtures thereof, e.g. acetone, 2-hexanone, 2-heptanone, methyl acetate, butyl acetate, and tetrahydrofuran. Photoresist materials used in the NTD process preferably form a photoresist layer that can form a negative image with organic solvent developer or a positive image with aqueous base developer such as tetraalkylammonium hydroxide solution. Preferably, the NTD photoresist is based on a polymer having acid sensitive (deprotectable) groups which, when deprotected, form carboxylic acid groups and/or hydroxyl groups.

Alternatively, development of the exposed photoresist layer can be accomplished by treating the exposed layer to a suitable developer capable of selectively removing the exposed portions of the film (where the photoresist is positive tone) or removing the unexposed portions of the film (where the photoresist is crosslinkable in the exposed regions, i.e., negative tone). Preferably, the photoresist is positive tone based on a polymer having acid sensitive (deprotectable) groups which form carboxylic acid groups when deprotected, and the developer is preferably a metal-ion free tetraalkylammonium hydroxide solution, such as, for example, aqueous 0.26 N tetramethylammonium hydroxide. A pattern forms by developing.

The developed substrate may then be selectively processed on those substrate areas bared of photoresist, for example, chemically etching or plating substrate areas bared of photoresist in accordance with procedures well known in the art. Suitable etchants include a hydrofluoric acid etching solution and a plasma gas etch such as an oxygen plasma etch. A plasma gas etch removes the underlying coating layer.

As discussed, in certain aspects, a wet etch process may be suitably employed. Wet etching may be suitably carried out by exposing the surface to be etched (e.g. a metal nitride, or metal nitride coated with one or more organic and/or inorganic layers) with a wet etch composition for a time and temperature effective to etch the surface (e.g. metal nitride surface and/or coating layers thereon). Exemplary wet etching compositions include an aqueous mixture of ammonium hydroxide and a peroxide such as hydrogen peroxide, or a mixture of an acid such as sulfuric acid and a peroxide such as hydrogen peroxide. See US 2006/0226122 for exemplary compositions. The examples which follow also provide exemplary wet etch process conditions. As referred to herein, a "wet etch process" means treating substrate areas defined by a adjoining photoresist (after development of the photoresist image) with a fluid composition typically either acid or alkaline in combination with a peroxide agent, but in any event distinguished from a plasma dry etch.

The following non-limiting examples are illustrative of the invention.

General Comments

In the below Examples, the following polymers are utilized and referred to by the specified polymer number, i.e. Polymer 1, Polymer 2 and Polymer 3.

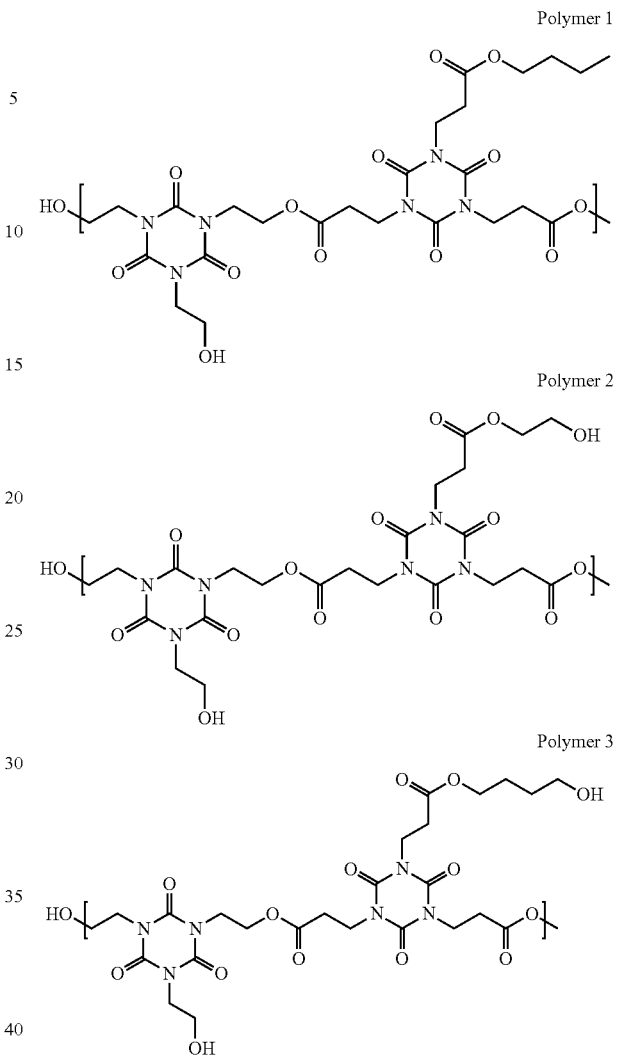

EXAMPLES 1-18: FORMULATION AND PROCESS FOR UNDERLAYER

Example 1

0.145 g of Polymer 1 shown immediately above, 0.013 g of a tetra methoxy methyl glycoluril as a crosslinker, 0.002 g of 2,4,6-Trimethylpyridinium p-toluenesulfonate salt, were dissolved in 99.84 g of methyl-2-hydroxy isobutyrate solvent to obtain the solution. All the prepared solutions were filtered through PTFE molecular weight polyethylene membrane filter. The solution was spin coated on a silicon wafer at 1500 rpm using a spinner and the wafer was heated at 205° C. for 1 minute on a hot plate to form thin film. Thickness measured by ellipsometer (M-2000) was about 50 Å.

Example 2

0.145 g of Polymer 1 shown above, 0.013 g of a tetra methoxy methyl glycoluril as a crosslinker, 0.002 g of 2,4,6-Trimethylpyridinium p-toluenesulfonate salt, were dissolved in 98.84 g of methyl-2-hydroxy isobutyrate and 1 g of gamma-butyrolactone solvent mixture to obtain the solution. All the prepared solutions were filtered through PTFE molecular weight polyethylene membrane filter. The solution was spin coated on a silicon wafer at 1500 rpm using a spinner and the wafer was heated at 205° C. for 1 minute on a hot plate to form thin film.

Example 3

0.145 g of Polymer 1 shown above, 0.013 g of a tetra methoxy methyl glycoluril as a crosslinker, 0.002 g of 2,4,6-Trimethylpyridinium p-toluenesulfonate salt, were dissolved in 96.84 g of methyl-2-hydroxy isobutyrate and 3 g of gamma-butyrolactone solvent mixture to obtain the solution. All the prepared solutions were filtered through PTFE molecular weight polyethylene membrane filter. The solution was spin coated on a silicon wafer at 1500 rpm using a spinner and the wafer was heated at 205° C. for 1 minute on a hot plate to form thin film.

Example 4

0.145 g of Polymer 1 shown above, 0.013 g of a tetra methoxy methyl glycoluril as a crosslinker, 0.002 g of 2,4,6-Trimethylpyridinium p-toluenesulfonate salt, were dissolved in 94.85 g of methyl-2-hydroxy isobutyrate and 4.99 g of gamma-butyrolactone solvent mixture to obtain the solution. All the prepared solutions were filtered through PTFE molecular weight polyethylene membrane filter. The solution was spin coated on a silicon wafer at 1500 rpm using a spinner and the wafer was heated at 205° C. for 1 minute on a hot plate to form thin film.

Example 5

0.145 g of Polymer 1 shown above, 0.013 g of a tetra methoxy methyl glycoluril as a crosslinker, 0.002 g of 2,4,6-Trimethylpyridinium p-toluenesulfonate salt, were dissolved in 89.86 g of methyl-2-hydroxy isobutyrate and 9.98 g of gamma-butyrolactone solvent mixture to obtain the solution. All the prepared solutions were filtered through PTFE molecular weight polyethylene membrane filter. The solution was spin coated on a silicon wafer at 1500 rpm using a spinner and the wafer was heated at 205° C. for 1 minute on a hot plate to form thin film.

Example 6

0.088 g of Polymer 2 shown above, 0.029 g of the polymer 3, 0.021 g of a tetra methoxy methyl glycoluril as a crosslinker, 0.002 g of 2,4,6-Trimethylpyridinium p-toluenesulfonate salt, were dissolved in 99.86 g of methyl-2-hydroxy isobutyrate solvent to obtain the solution. All the prepared solutions were filtered through PTFE molecular weight polyethylene membrane filter. The solution was spin coated on a silicon wafer at 1500 rpm using a spinner and the wafer was heated at 205° C. for 1 minute on a hot plate to form thin film. Thickness measured by ellipsometer (M-2000) was about 50 Å.

Example 7

0.088 g of Polymer 2 shown above, 0.029 g of the polymer 3, 0.021 g of a tetra methoxy methyl glycoluril as a crosslinker, 0.002 g of 2,4,6-Trimethylpyridinium p-toluenesulfonate salt, were dissolved in 98.86 g of methyl-2-hydroxy isobutyrate and 1 g of gamma-butyrolactone solvent mixture to obtain the solution. All the prepared solutions were filtered through PTFE molecular weight polyethylene membrane filter. The solution was spin coated on a silicon wafer at 1500 rpm using a spinner and the wafer was heated at 205° C. for 1 minute on a hot plate to form thin film.

Example 8

0.088 g of Polymer 2 shown above, 0.029 g of the polymer 3, 0.021 g of a tetra methoxy methyl glycoluril as a crosslinker, 0.002 g of 2,4,6-Trimethylpyridinium p-toluenesulfonate salt, were dissolved in 96.86 g of methyl-2-hydroxy isobutyrate and 3 g of gamma-butyrolactone solvent mixture to obtain the solution. All the prepared solutions were filtered through PTFE molecular weight polyethylene membrane filter. The solution was spin coated on a silicon wafer at 1500 rpm using a spinner and the wafer was heated at 205° C. for 1 minute on a hot plate to form thin film.

Example 9

0.088 g of Polymer 2 shown above, 0.029 g of the polymer 3, 0.021 g of a tetra methoxy methyl glycoluril as a crosslinker, 0.002 g of 2,4,6-Trimethylpyridinium p-toluenesulfonate salt, were dissolved in 94.87 g of methyl-2-hydroxy isobutyrate and 4.99 g of gamma-butyrolactone solvent mixture to obtain the solution. All the prepared solutions were filtered through PTFE molecular weight polyethylene membrane filter. The solution was spin coated on a silicon wafer at 1500 rpm using a spinner and the wafer was heated at 205° C. for 1 minute on a hot plate to form thin film.

Example 10

0.088 g of Polymer 2 shown above, 0.029 g of the polymer 3, 0.021 g of a tetra methoxy methyl glycoluril as a crosslinker, 0.002 g of 2,4,6-Trimethylpyridinium p-toluenesulfonate salt, were dissolved in 89.87 g of methyl-2-hydroxy isobutyrate and 9.99 g of gamma-butyrolactone solvent mixture to obtain the solution. All the prepared solutions were filtered through PTFE molecular weight polyethylene membrane filter. The solution was spin coated on a silicon wafer at 1500 rpm using a spinner and the wafer was heated at 205° C. for 1 minute on a hot plate to form thin film.

Example 11

0.145 g of Polymer 1 shown above, 0.013 g of a tetra methoxy methyl glycoluril as a crosslinker, 0.002 g of 2,4,6-Trimethylpyridinium p-toluenesulfonate salt, were dissolved in 97.84 g of methyl-2-hydroxy isobutyrate and 2 g of propylene glycol methyl ether acetate solvent mixture to obtain the solution. All the prepared solutions were filtered through PTFE molecular weight polyethylene membrane filter. The solution was spin coated on a silicon wafer at 1500 rpm using a spinner and the wafer was heated at 205° C. for 1 minute on a hot plate to form thin film.

Example 12

0.145 g of Polymer 1 shown above, 0.013 g of a tetra methoxy methyl glycoluril as a crosslinker, 0.002 g of 2,4,6-Trimethylpyridinium p-toluenesulfonate salt, were dissolved in 97.84 g of methyl-2-hydroxy isobutyrate and 2 g of propylene glycol monomethyl ether solvent mixture to obtain the solution. All the prepared solutions were filtered through PTFE molecular weight polyethylene membrane filter. The solution was spin coated on a silicon wafer at 1500 rpm using a spinner and the wafer was heated at 205° C. for 1 minute on a hot plate to form thin film.

Example 13

0.145 g of Polymer 1 shown above, 0.013 g of a tetra methoxy methyl glycoluril as a crosslinker, 0.002 g of 2,4,6-Trimethylpyridinium p-toluenesulfonate salt, were dissolved in 97.84 g of methyl-2hydroxy isobutyrate and 2 g of ethyl ethoxy propionate solvent mixture to obtain the solution. All the prepared solutions were filtered through PTFE molecular weight polyethylene membrane filter. The solution was spin coated on a silicon wafer at 1500 rpm using a spinner and the wafer was heated at 205° C. for 1 minute on a hot plate to form thin film.

Example 14

0.145 g of Polymer 1 shown above, 0.013 g of a tetra methoxy methyl glycoluril as a crosslinker, 0.002 g of 2,4,6-Trimethylpyridinium p-toluenesulfonate salt, were dissolved in 97.84 g of methyl-2-hydroxy isobutyrate and 2 g of ethyl lactate solvent mixture to obtain the solution. All the prepared solutions were filtered through PTFE molecular weight polyethylene membrane filter. The solution was spin coated on a silicon wafer at 1500 rpm using a spinner and the wafer was heated at 205° C. for 1 minute on a hot plate to form thin film.

Example 15

0.145 g of Polymer 1 shown above, 0.013 g of a tetra methoxy methyl glycoluril as a crosslinker, 0.002 g of 2,4,6-Trimethylpyridinium p-toluenesulfonate salt, were dissolved in 97.84 g of methyl-2-hydroxy isobutyrate and 2 g of cyclohexanone solvent mixture to obtain the solution. All the prepared solutions were filtered through PTFE molecular weight polyethylene membrane filter. The solution was spin coated on a silicon wafer at 1500 rpm using a spinner and the wafer was heated at 205° C. for 1 minute on a hot plate to form thin film.

Example 16

0.145 g of Polymer 1 shown above, 0.013 g of a tetra methoxy methyl glycoluril as a crosslinker, 0.002 g of 2,4,6-Trimethylpyridinium p-toluenesulfonate salt, were dissolved in 97.84 g of methyl-2hydroxy isobutyrate and 2 g of gamma-butyrolactone solvent mixture to obtain the solution. All the prepared solutions were filtered through PTFE molecular weight polyethylene membrane filter. The solution was spin coated on a silicon wafer at 1500 rpm using a spinner and the wafer was heated at 205° C. for 1 minute on a hot plate to form thin film.

Example 17

0.145 g of Polymer 1 shown above, 0.013 g of a tetra methoxy methyl glycoluril as a crosslinker, 0.002 g of 2,4,6-Trimethylpyridinium p-toluenesulfonate salt, were dissolved in 97.84 g of methyl-2hydroxy isobutyrate and 2 g of N-methylpyrrolidine solvent mixture to obtain the solution. All the prepared solutions were filtered through PTFE molecular weight polyethylene membrane filter. The solution was spin coated on a silicon wafer at 1500 rpm using a spinner and the wafer was heated at 205° C. for 1 minute on a hot plate to form thin film.

Example 18

0.145 g of Polymer 1 shown above, 0.013 g of a tetra methoxy methyl glycoluril as a crosslinker, 0.002 g of 2,4,6-Trimethylpyridinium p-toluenesulfonate salt, were dissolved in 97.84 g of methyl-2-hydroxy isobutyrate and 2 g of benzyl benzoate solvent mixture to obtain the solution. All the prepared solutions were filtered through PTFE molecular weight polyethylene membrane filter. The solution was spin coated on a silicon wafer at 1500 rpm using a spinner and the wafer was heated at 205° C. for 1 minute on a hot plate to form thin film.

Example 19:Evaluation of Lithographic Performance

Film Surface Uniformity Measurement by AFM (Atomic Force Microscopy)

Part 1. The surface of coated wafers of above Examples 1-10 were observed and the pinhole is detected by AFM instrument. Results are set forth in FIG. 1 which shows that pinholes were not observed in films formed with compositions containing gamma-butyrolactone. In FIG. 1, reference is made with each AFM image to the composition of the specified Example number that is being shown in the particular AFM image.

Figure 2:
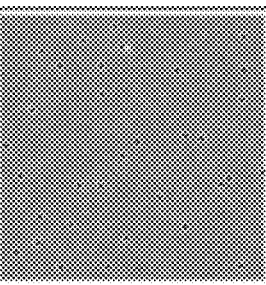
FIG. 2 are surface images of applied and thermally treated composition coating layers of Examples 11-18 detected by atomic force microscopy (AFM).
Figure 2:
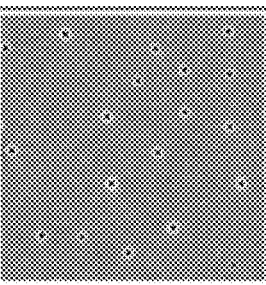
Figure 2:
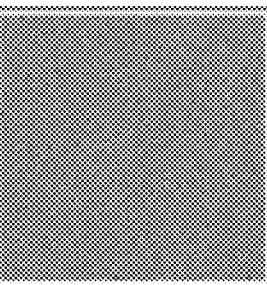
Figure 2:
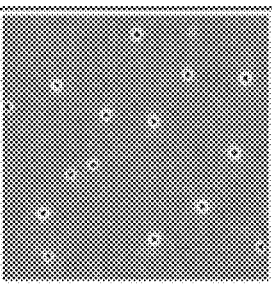
Figure 2:
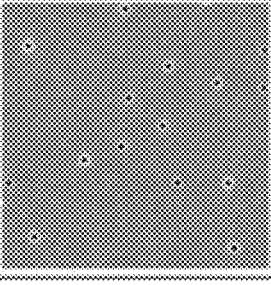
Figure 2:
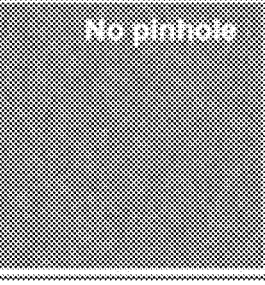
Figure 2:
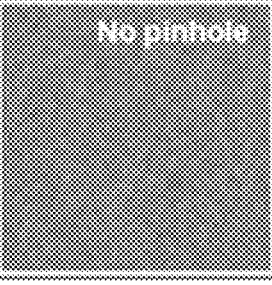
Figure 2:
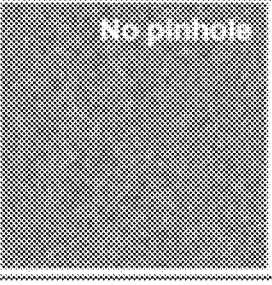

Part 2. The surfaces of additional coated wafers of above Examples 11-18 were observed for the presence of undesired pinhole with use of an AFM instrument. Results are set forth in FIG. 2 and show pinhole-free coating layers of compositions that have additional solvents with boiling greater than 200° C. In FIG. 2, reference is made with each AFM image to the composition of the specified Example number that is being shown in the particular AFM image.

What is claimed is:

1. A method for forming a photoresist relief image, comprising:
    a) applying on a substrate a layer of a fluid coating composition comprising:
        i) a resin; and
        ii) a solvent component comprising one or more of N-methyl pyrrolidine and benzyl benzoate;
    b) applying a layer of a photoresist composition above the coating composition layer; and
    c) imaging the photoresist composition layer with activating radiation and developing the imaged photoresist composition layer to provide a photoresist composition relief image.

2. The method of claim 1 wherein at least 0.5 weight percent of the total weight percent of all solvent present in the coating composition has a boiling of 200° C. or greater.

3. The method of claim 2 wherein no more than 20 weight percent of the total weight percent of all solvent present in the coating composition has a boiling of 200° C. or greater.

4. The method of claim 1 wherein the coating composition further comprises a crosslinker component.

5. The method of claim 4 wherein the solvent component comprises N-methyl pyrrolidine.

6. The method of claim 4 wherein the solvent component comprises benzyl benzoate.

7. The method of claim 1 wherein the photoresist composition layer is imaged with EUV radiation.

8. The method of claim 1 wherein the coating composition layer is thermally treated to remove solvent and provide a thermally treated coating composition layer having a thickness that does not exceed 100 angstroms.

9. The method of claim 1 wherein the coating composition is spin coated on the substrate and thermally treated to provide a coating composition layer that is at least substantially free of pinholes.

10. The method of claim 1 wherein the solvent component comprises N-methyl pyrrolidine.

11. The method of claim 1 wherein the solvent component comprises benzyl benzoate.

* * * * *